(12) United States Patent
Kim

(10) Patent No.: US 7,045,380 B2
(45) Date of Patent: May 16, 2006

(54) CMOS IMAGE SENSOR AND METHOD OF FABRICATING THE SAME

(75) Inventor: Yi-Tae Kim, Seoul (KR)

(73) Assignee: Samsung Electronics Co., Ltd., (KR)

( * ) Notice: Subject to any disclaimer, the term of this patent is extended or adjusted under 35 U.S.C. 154(b) by 48 days.

(21) Appl. No.: 10/641,661

(22) Filed: Aug. 15, 2003

(65) Prior Publication Data
US 2004/0089883 A1     May 13, 2004

(30) Foreign Application Priority Data
Aug. 20, 2002  (KR)  ............. 10-2002-0049133

(51) Int. Cl.
 *H01L 21/00*     (2006.01)
(52) U.S. Cl. .............. 438/48; 438/199; 257/291
(58) Field of Classification Search ............ 257/233, 257/239, 291, 292, 290; 438/48, 60, 66
See application file for complete search history.

(56) References Cited

U.S. PATENT DOCUMENTS

| | | | | |
|---|---|---|---|---|
| 5,801,094 A | * | 9/1998 | Yew et al. | 438/624 |
| 5,923,998 A | * | 7/1999 | Liu | 438/526 |
| 6,051,857 A | * | 4/2000 | Miida | 257/292 |
| 6,071,798 A | * | 6/2000 | Yaung et al. | 438/526 |
| 6,291,280 B1 | * | 9/2001 | Rhodes | 438/199 |
| 6,433,373 B1 | * | 8/2002 | Lee et al. | 257/292 |
| 6,639,261 B1 | * | 10/2003 | Rhodes | 257/291 |

* cited by examiner

*Primary Examiner*—Jerome Jackson
*Assistant Examiner*—José R. Diaz
(74) *Attorney, Agent, or Firm*—F. Chau & Associates LLC

(57) ABSTRACT

An image sensor and a fabricating method thereof are provided. The image sensor includes a floating diffusion region disposed at a predetermined region of a substrate, a photodiode region, and a source plug disposed on the floating diffusion region. Further, the sensor includes conductive patterns that may be used as gate electrodes of transistors. The conductive pattern and the source plug may have the same thickness and composition. Preferably, the source plug and the conductive pattern are made of polysilicon containing impurities. The fabricating method includes forming an insulating pattern on the semiconductor substrate having an opening exposing a predetermined region of the substrate, and forming a conductive pattern across the opening on the resultant structure. The conductive pattern may be made of polysilicon containing impurities. The impurities contained in the gate conductive pattern may be diffused to the substrate through the opening in the gate insulating pattern to form the floating diffusion region in the semiconductor substrate below the opening. As a result, lattice defects and etch damage in the floating diffusion region are minimized.

15 Claims, 7 Drawing Sheets

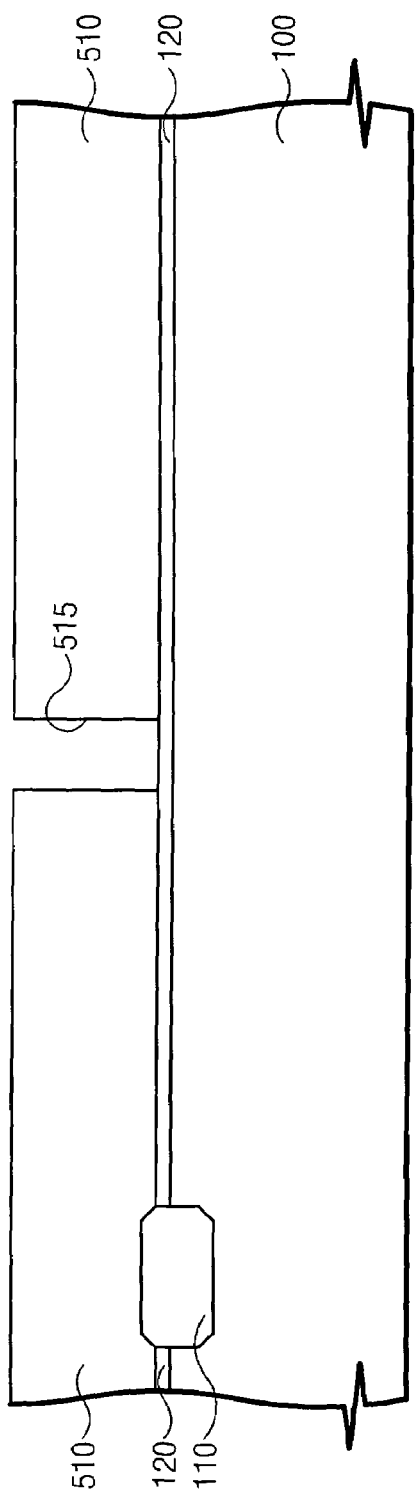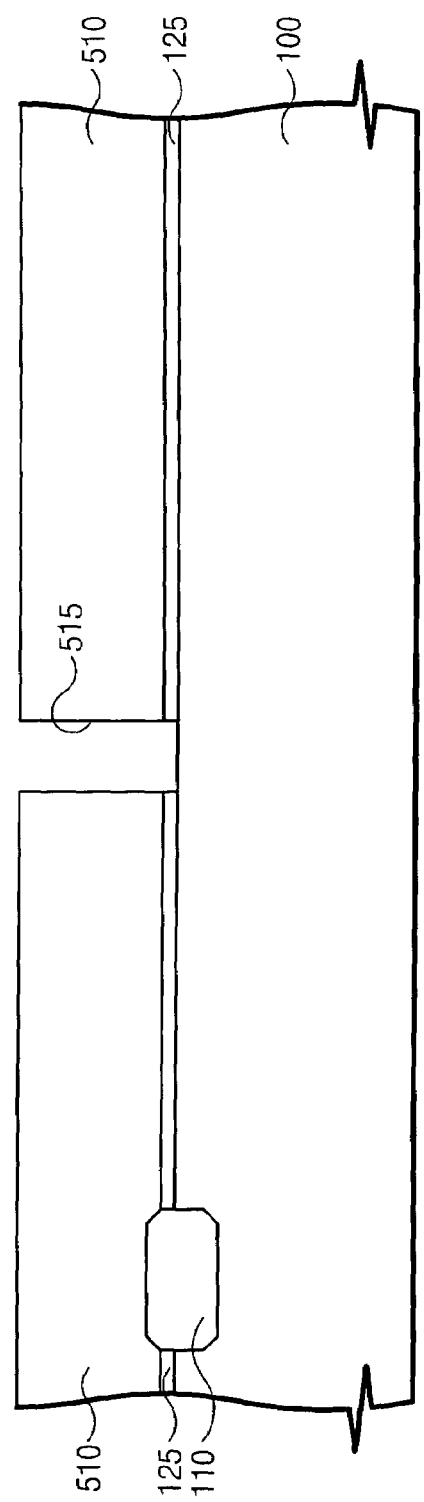

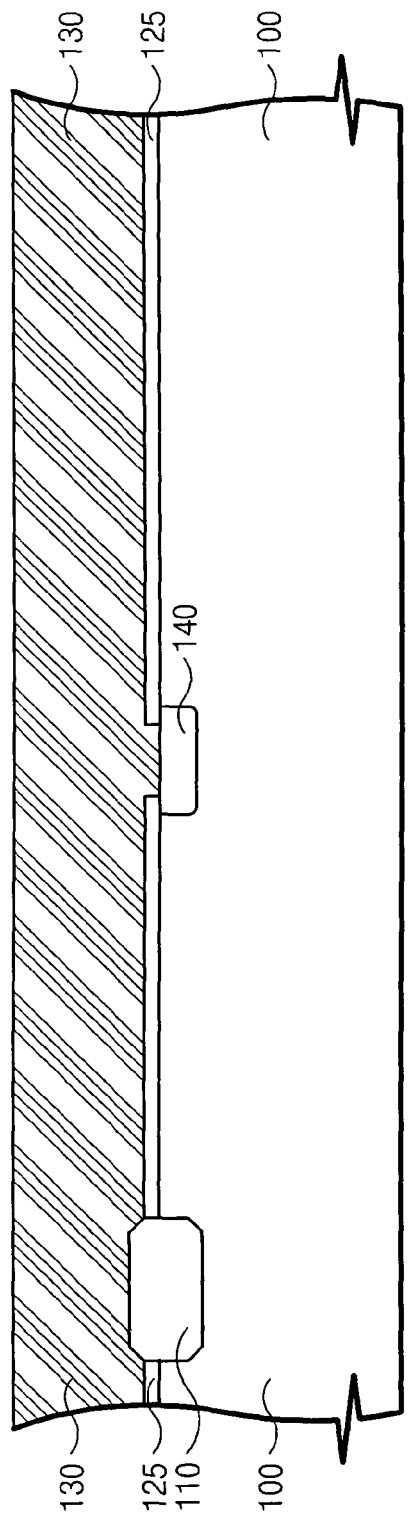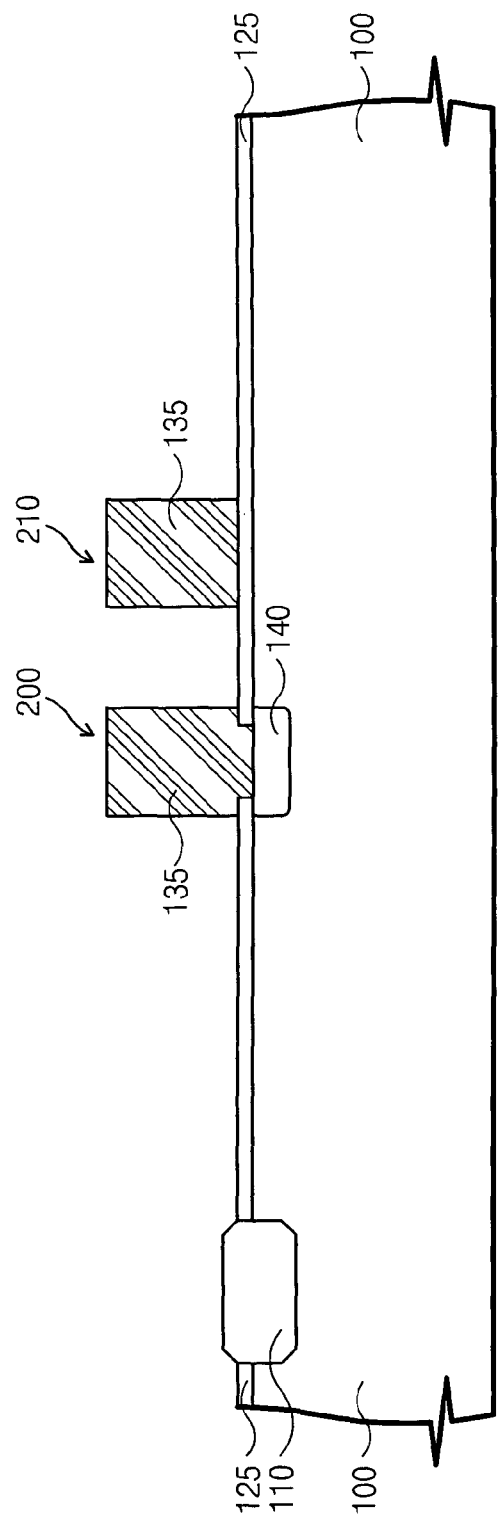

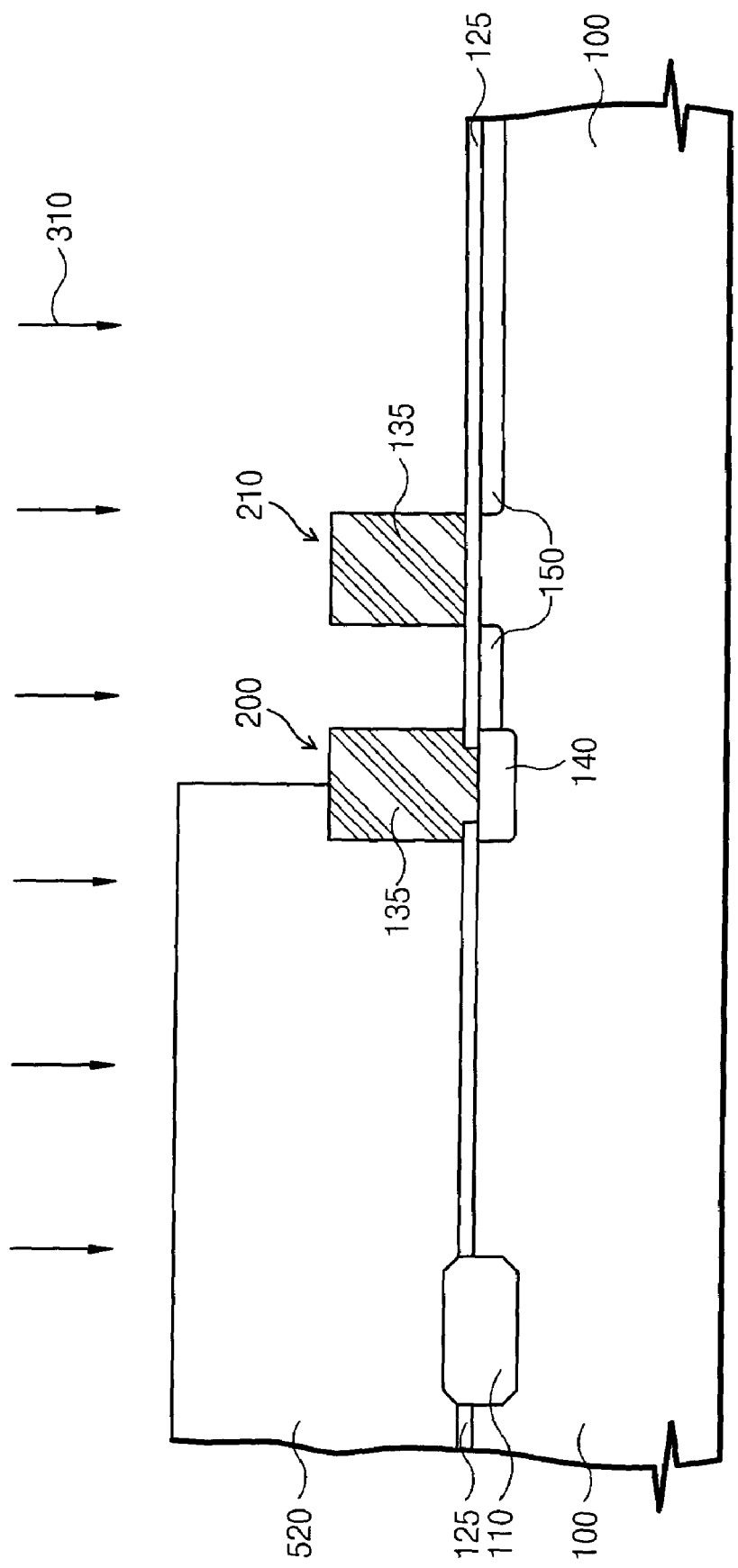

and the isolation layer between the floating diffusion region and the photodiode region.

CMOS IMAGE SENSOR AND METHOD OF FABRICATING THE SAME

FIELD OF THE INVENTION

The present invention relates to a semiconductor memory device and a method of fabricating the same. More particularly, the present invention is directed to a CMOS image sensor and a method of fabricating the same.

BACKGROUND OF THE INVENTION

A complementary metal-oxide-silicon (CMOS) image sensor is a device for converting optical images into electrical signals. The CMOS image sensor uses MOS transistors as switching devices for sequentially transferring electrical signals. A CMOS image sensor has certain advantages over a charge coupled device (CCD) image sensor. For example, the CMOS image sensor costs less to manufacture and consumes less power than a CCD image sensor. In addition, a CCD image sensor is more difficult to fabricate than the CMOS image sensor. Random access is impossible in the CCD image sensor, but is possible in the CMOS image sensor. From the late 1990's to recently, CMOS fabricating techniques have been developed and signal processing algorithms have been enhanced to improve the CMOS image sensor.

According to the number of transistors included in a unit pixel, the CMOS image sensor is categorized as 1-transistor structure, 2-transistor structure, 3-transistor structure, and 4-transistor structure. The 1-transistor structure has a high fill-factor (i.e., percentage of light sensitive area of a pixel) but suffers from loud noise. Accordingly, some CMOS image sensors adopt the 3-transistor structure and the 4-transistor structure. As compared to the 4-transistor structure, the 3-transitor structure has a lower manufacturing cost, higher fill-factor, and excellent properties for image lagging and blooming.

A method of fabricating a conventional CMOS image sensor having a 3-transistor structure is explained with reference to FIG. 1.

Referring to FIG. 1, a device isolation layer 20 is formed at a predetermined region of a semiconductor substrate 10 to define an active region. A silicon oxide layer is formed on the active region to be a gate insulating layer 30. A gate conductive layer is formed on the semiconductor substrate 10 including the gate insulating layer 30. The gate conductive layer is patterned to form a plurality of gate conductive patterns 40 across the active region. The gate conductive patterns 40 constitute gate electrodes of a reset transistor, a selection transistor, and an access transistor, which, in turn, constitute a CMOS image sensor having the 3-transistor structure. Only the gate conductive pattern 40 constituting the gate electrode of the reset transistor is illustrated in FIG. 1.

Following formation of the gate conductive pattern 40, a lightly doped region 94 is formed at the active region around the gate conductive pattern 40. A photodiode region 99 is formed at the active region adjacent to a source region of the reset transistor. Light impinges on the photodiode region 99. Following formation of the lightly doped region 94 and the photodiode region 99, a spacer 50 is formed on sidewalls of the gate conductive pattern 40. Using the spacer 50 as a mask, an ion implanting process is carried out to form a heavily doped region 92 which may constitute source and/or drain regions of the reset, select, and access transistors.

During formation of the heavily doped region 92, a floating diffusion region 96 is formed and connected to the source of the reset transistor.

An interlayer dielectric layer 60 is formed on the semiconductor substrate including the heavily doped region 92. The interlayer dielectric layer 60 is patterned to form an opening 65 exposing a top surface of the floating diffusion region 96, the heavily doped region 92, and the gate conductive pattern 40. By a method known to those of skill in the art, a plug/interconnection 70 is formed to interconnect the source and/or drain and the gate of the transistors.

In a case where the floating diffusion region 96 is formed by the ion implanting process, the kinetic energy of the ions causes lattice defects, e.g., dislocation and vacancies, in the floating diffusion region 96. Since a patterning process for forming the opening 65 includes a step of anisotropically etching the interlayer dielectric layer 60 using plasma, the floating diffusion region 96 is damaged. Additionally, a conventional siliciding process for reducing a resistance is carried out to contaminate the floating diffusion region 96 with metal materials. The floating diffusion region 96, which is a component of a CMOS image sensor, has a significant influence on the characteristics of the CMOS image sensor. In order to achieve desirable characteristics of the CMOS image sensor, lattice defects, etching damage, and metal contamination in the floating diffusion region must be minimized. Accordingly, there exists a need for a CMOS image sensor that minimizes such defects and a method of fabricating same.

SUMMARY OF THE INVENTION

The present invention provides a CMOS image sensor having desirable characteristics, and a method of fabricating same.

In accordance with the present invention, an image sensor includes a substrate of a first conductivity type, a floating diffusion region of a second conductivity type which is disposed in a predetermined region of the substrate, a photodiode region which is adjacent to the floating diffusion region and is disposed in the substrate, and a source plug which contacts the floating diffusion region.

In alternate embodiments, the image sensor may include reset and select transistors and conductive patterns used as each gate electrode of the reset and select transistors. Preferably, at least one conductive pattern and the source plug have the same thickness and are made of the same conductivity type impurities. Further, the image sensor may include an interconnection for connecting the source plug with one of the conductive patterns used as the gate electrode of the select transistor.

Preferably, the source plug may be made of polysilicon containing impurities. The photodiode region may include impurities of the second conductivity type. Further, the CMOS image sensor may include an insulating pattern interposed between at least one of the conductive patterns and the substrate. The insulating pattern may include an opening exposing the floating diffusion region. The source plug may contact the floating diffusion region through the opening.

An access transistor may be further connected to the source of the select transistor. Preferably, the gate electrode of the access transistor is formed of the gate conductive pattern. Meanwhile, the photodiode region may be formed apart from the floating diffusion region. Here, the gate conductive pattern may be disposed on the active region between the photodiode region and the floating diffusion region to constitute the gate electrode of the access transistor.

A method of fabricating an image sensor, in accordance with an embodiment of the present invention, includes forming an insulating layer on a substrate, patterning the insulating layer to form an insulating pattern having an opening exposing a predetermined region of the substrate, forming a conductive layer on the substrate including the insulating pattern, and patterning the conductive layer to form a plurality of conductive patterns. One of the conductive patterns is formed across the opening.

In alternate embodiments, a floating diffusion region is further formed in the substrate below the opening. The conductive pattern may contact the floating diffusion region. Preferably, the conductive layer is made of polysilicon containing impurities. Preferably, the polysilicon including the impurities is formed using at least one of diffusion, ion implantation, and in-situ doping.

The insulating layer may be made of silicon oxide or include a silicon oxide layer and an upper insulating layer that are stacked on each other. Preferably, the upper insulating layer is made of a material that can be etched more rapidly than the silicon oxide layer. A pre-floating diffusion region may be further formed on the substrate under the opening. The pre-floating diffusion region is formed using at least one of diffusion, ion implantation, and in-situ doping. The upper insulating layer is preferably removed by means of an etch recipe, wherein an etch rate of the upper insulating layer is faster than an etch rate of the silicon oxide layer.

The image sensor may include reset and select transistors and the conductive patterns may include gates of the reset and select transistors. The method may further include forming a photodiode region in the substrate adjacent to the floating diffusion region, forming source and drain regions of the select and reset transistors, and forming an interconnection between the respective gates and sources and drains of the reset and select transistors. The photodiode region is formed in the substrate adjacent to the floating diffusion region.

The conductive pattern formed across the opening may constitute a gate of the select transistor or be electrically connected to the gate of the select transistor.

BRIEF DESCRIPTION OF THE DRAWINGS

Preferred embodiments of the invention can be understood in more detail from the following descriptions taken in conjunction with the accompanying drawings in which:

FIGS. 2 through 8 are cross-sectional views of a CMOS image sensor for explaining a method of fabricating same according to an embodiment of the present invention.

DETAILED DESCRIPTION OF THE PREFERRED EMBODIMENTS

Figure 1:
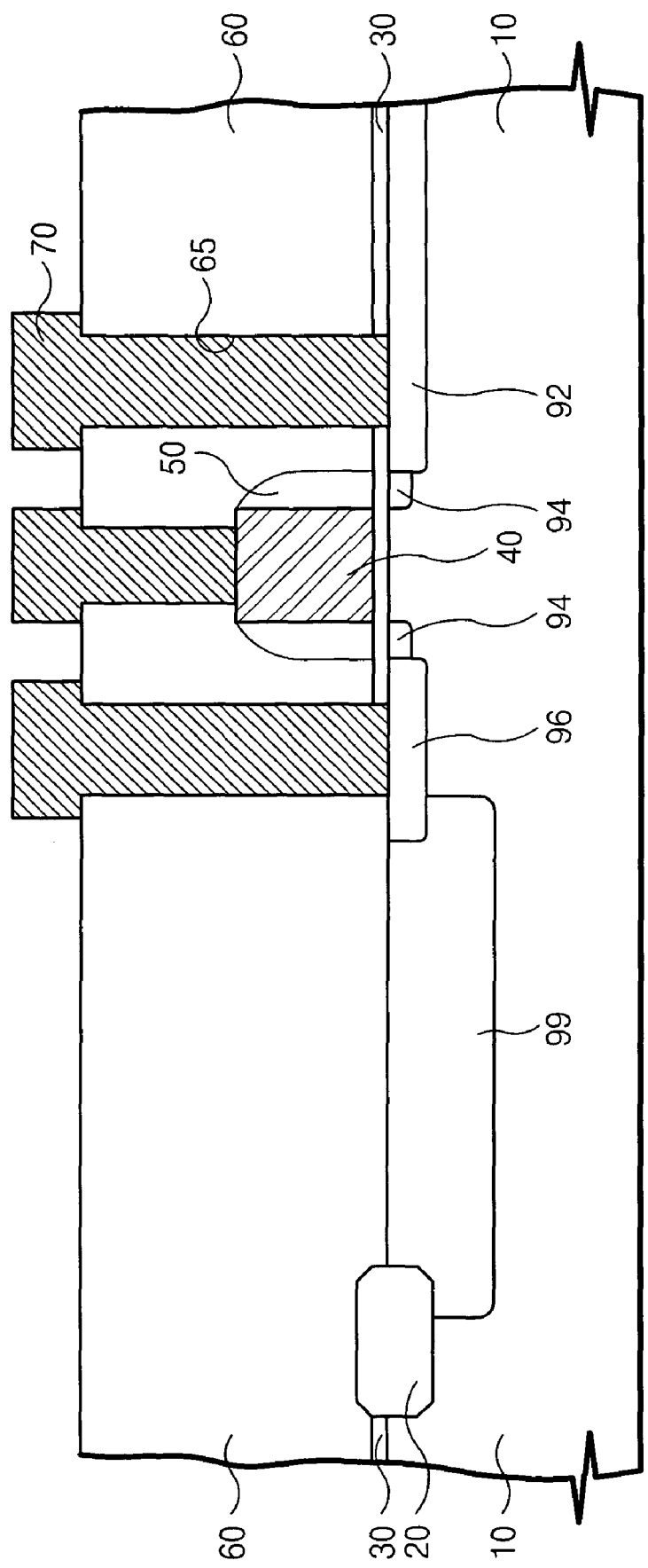
FIG. 1 is a cross-sectional view of a conventional CMOS image sensor for explaining a method of fabricating same.

Preferred embodiments of the present invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

A method of fabricating a CMOS image sensor according to an embodiment of the present invention is now described below with reference to FIGS. 2 through 8.

Referring to FIG. 2, a device isolation layer 110 is formed at a predetermined region of a semiconductor substrate 100 to define an active region. The semiconductor substrate 100 may be a silicon substrate where a P-type epitaxial layer is formed. In this case, a deep P-well may be formed at the boundary of the silicon substrate and a P-type epitaxial layer. Here an impurity density of the deep P-well is higher than that of the P-type epitaxial layer.

A gate insulating layer 120 is formed on the active region. Preferably, the gate insulating layer 120 is a silicon oxide layer which is formed by thermally oxidizing the exposed top surface of the semiconductor substrate 100. A photoresist pattern 510 with an opening 515 exposing the gate insulating layer 120 is formed on the gate insulating layer 120. The opening 515 defines the location where a floating diffusion region of the CMOS image sensor will be formed.

Referring to FIG. 3, using the photoresist pattern 510 as a mask, the exposed gate insulating layer 120 is etched to form a gate insulating pattern 125 with the opening 515 exposing the top surface of the semiconductor substrate 100.

As previously stated, etch damage occurring at the floating diffusion region degrades the characteristics of the CMOS image sensor. In order to overcome this problem, the gate insulating layer 120 may be wet etched. Alternatively, the gate insulating layer 120 may be dry etched and a subsequent process of curing the etch damage may be carried out. In general, the curing process is a high-temperature thermal process. Therefore, it is desirable that the curing process be carried out before formation of an impurity region or formation of a low melting point material.

Referring to FIG. 4, following removal of the photoresist pattern 510, a gate conductive layer 130 is formed on an entire surface of the resultant structure. Accordingly, the gate insulating pattern 125 is interposed between the gate conductive layer 130 and the semiconductor substrate 100. As shown in FIG. 3, the opening in the gate insulating pattern 125 is formed to expose the top surface of the semiconductor substrate 100 where the floating diffusion region will be formed. As a result, the gate conductive layer 130 is in direct contact with the semiconductor substrate 100 through the opening in the gate insulating layer 125.

Preferably, the gate conductive layer 130 is made of polysilicon containing impurities which are formed using one of diffusion, ion implantation, and in-situ doping. Preferably, the impurities contained in the gate conductive layer 130 have an N-conductivity type.

The impurities contained in the gate conductive layer 130 are diffused to the semiconductor substrate 100 through the opening in the gate insulating pattern 125 to form a floating diffusion region 140. Since the floating diffusion region 140 is formed by the diffusion, it is possible to prevent lattice defects caused by conventional methods employing ion implantation.

The gate conductive layer 130 may further include at least one material, such as metal or silicide, which is disposed on the polysilicon.

Referring to FIG. 5, the gate conductive layer 130 is patterned to form a plurality of gate conductive patterns 135 across the active region. Preferably, an etching process for forming the gate conductive patterns 135 employs an anisotropic etching technique, wherein the etch rate of the gate conductive layer 130 is faster than the etch rate of the gate insulating pattern 125.

The gate conductive patterns 135 constitute gate electrodes 210 of the reset, select, and access transistors in the CMOS image sensor according to the present invention. Further, the gate conductive pattern 135 forms a source plug 200 across the floating diffusion region 140. The gate conductive pattern 135 forming the source plug 200 may be used as the gate electrode 210 of the select transistor. In this case, the gate conductive pattern 135 extends from the gate electrode 210 of the select transistor to the floating diffusion region 140. The gate conductive pattern 135 may also constitute a transfer transistor, resulting in the CMOS image sensor having a 4-transistor structure.

Referring to FIG. 6, following formation of the gate conductive patterns 135, a photoresist pattern 520 is formed to expose the active region around the gate electrode 210. A region that the photoresist pattern 520 covers includes an active region around the floating diffusion region 140. In the active region, a photodiode region will be formed in a subsequent process.

Using the photoresist pattern 520 as a mask, an ion implanting process 310 is carried out to form a lightly doped region 150 in the exposed active region. The lightly doped region 150 is disposed around each gate electrode 210 of the reset, select and access transistors to constitute their sources and/or drains.

Figure 7:
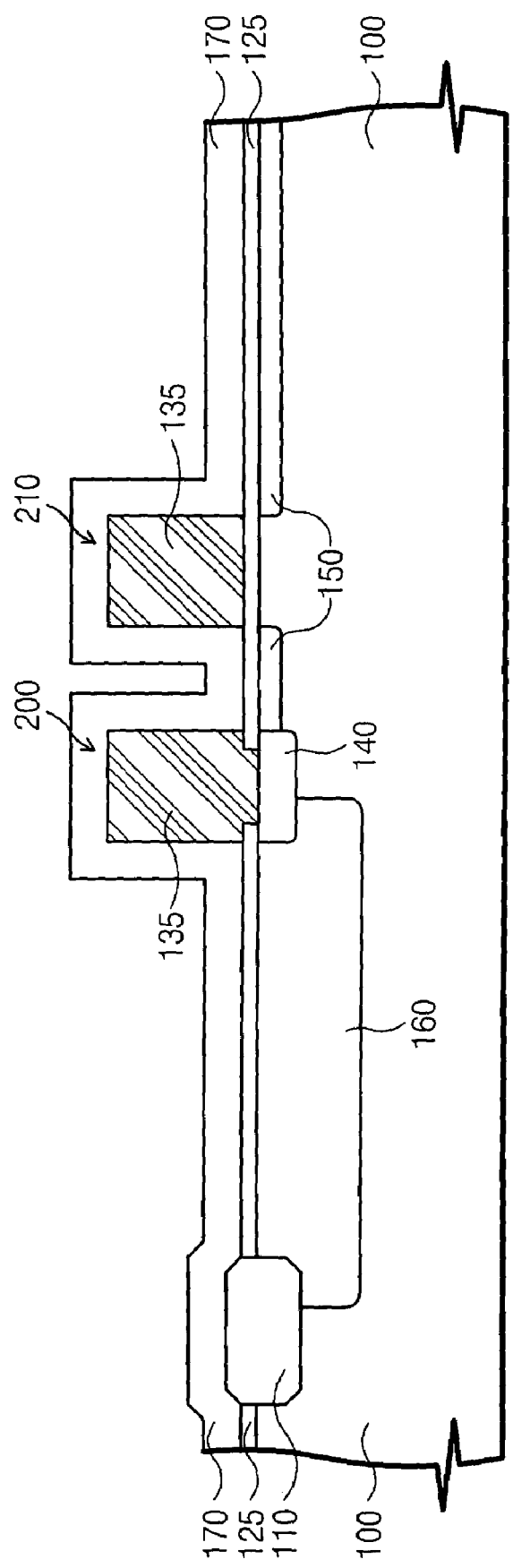

Referring to FIG. 7, the photoresist pattern 520 used for forming the lightly doped region 150 is removed. Another photoresist pattern (not shown) is then formed to expose the active region around the source plug 200. Using another photoresist pattern as a mask, an ion implanting process is carried out to form a photodiode region 160 in the exposed active region. This photoresist pattern is also removed. The order in which the step of forming the photodiode region 160 and the step of forming the lightly doped region 150 is interchangeable.

A spacer layer 170 is formed on an entire surface of the resultant structure where the photodiode region 160 is formed. Preferably, the spacer layer 170 is made of silicon nitride, silicon oxide, or silicon oxynitride.

Figure 8:
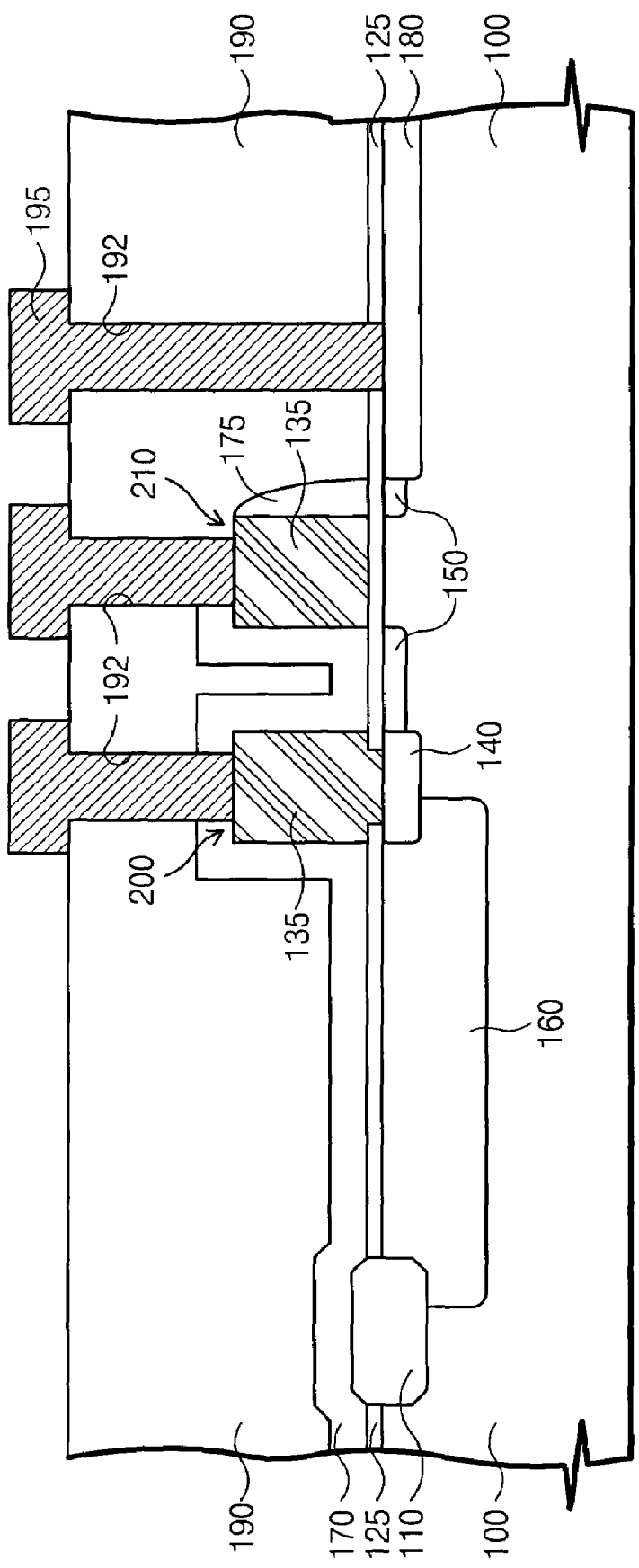

Referring to FIG. 8, the spacer layer 170 is anisotropically etched to form a spacer 175 on sidewalls of the gate electrode 210. Preferably, the anisotropic etching uses a photoresist pattern (not shown) covering the photodiode region 160 as an etching mask. Accordingly, the spacer layer 170 remains on the photodiode region 160.

Using the photoresist pattern and the spacer 175 as an ion implanting mask, an ion implanting process is carried out to form a heavily doped region 180 at the lightly doped region 150 around the gate electrode 210.

An interlayer dielectric layer 190 is formed to cover an entire surface of a semiconductor substrate 100 where the heavily doped region 180 is formed. Preferably, the interlayer dielectric layer 190 is a silicon oxide layer that is formed by chemical vapor deposition (CVD). The interlayer dielectric layer 190 is patterned to form an opening 192 exposing the gate conductive pattern 135 and the heavily doped region 180. The opening 192 for connecting to the floating diffusion region 140 exposes an upper portion of the source plug 200. Therefore, it is possible to prevent etch damage to the floating diffusion region 160 during formation of the opening 192 because a surface of the floating diffusion region 160 is not exposed.

Thereafter, plugs/interconnections 195 are formed which are connected to the gate conductive pattern 135 and the heavily doped region 180 via the openings 192. The source plug 200 may be connected to the gate electrode 210 of the select transistor via the plug/interconnection 195.

A method of fabricating a CMOS image sensor according to a second embodiment of the present invention is now described below with reference to FIGS. 9 and 10. The second embodiment has some of the same steps as the first embodiment, and only different steps will be explained in detail.

Figure 9:
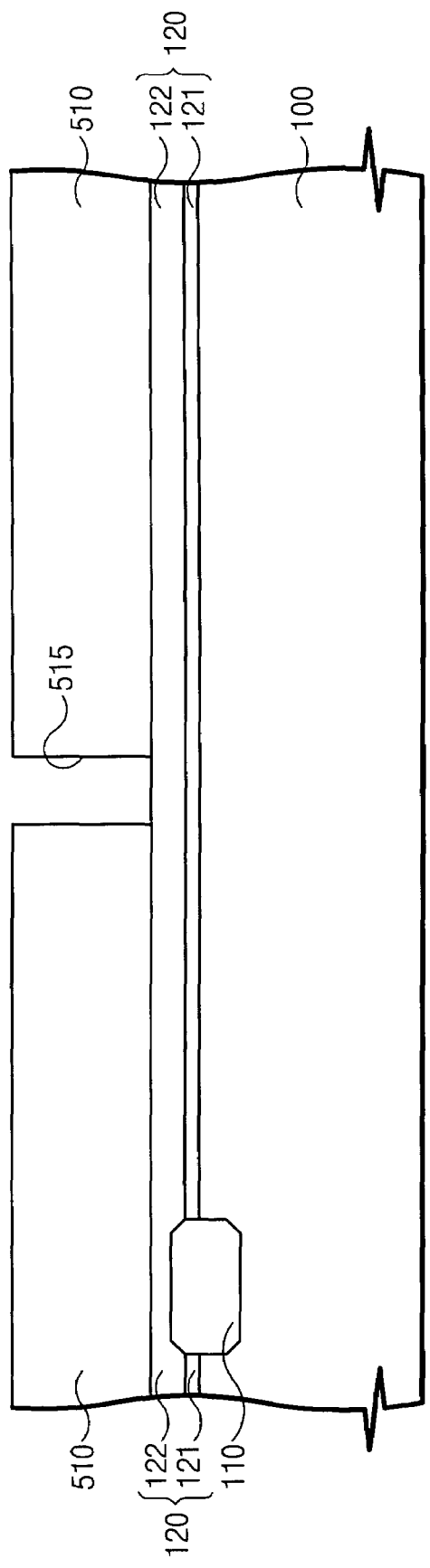
FIGS. 9 and 10 are cross-sectional views of a CMOS image sensor for explaining a method of fabricating same according to another embodiment of the present invention.

Referring to FIG. 9, a device isolation layer 110 is formed at a predetermined region of the semiconductor substrate 100 to define an active region. A gate insulating layer 120 is formed on the active region. Preferably, the gate insulating layer 120 includes a silicon oxide layer 121 and an upper insulating layer 122 which are sequentially stacked. Similar to the first embodiment, the silicon oxide layer 121 is preferably formed by thermally oxidizing the exposed semiconductor substrate 100. The upper insulating layer 122 is made of a material that can be etched more rapidly than the silicon oxide layer 121. Thus, the upper insulating layer 122 is preferably made of either silicon nitride or silicon oxynitride. Similar to the first embodiment, a photoresist pattern 510 having an opening 515 for defining a floating diffusion region is formed.

Figure 10:
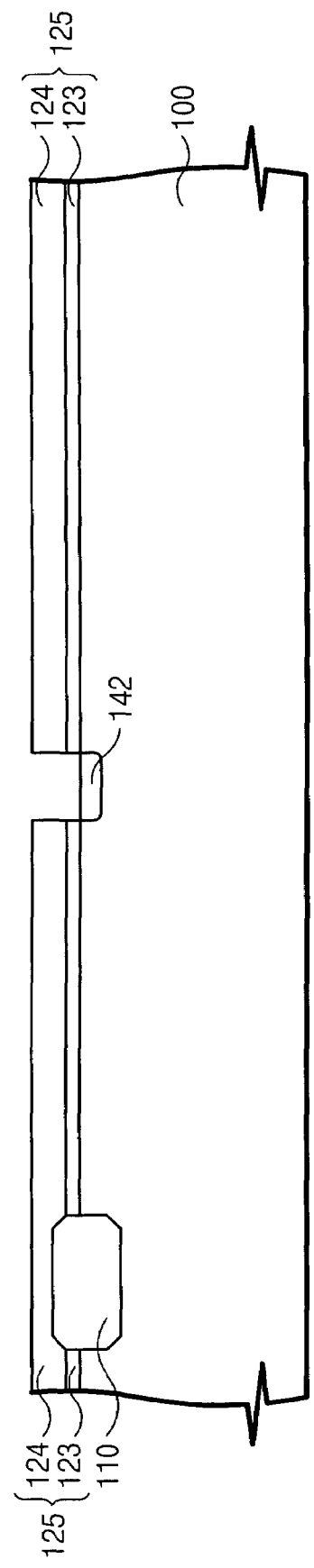

Referring to FIG. 10, using the photoresist pattern 510 as a mask, the gate insulating layer 120 is patterned to form a gate insulating pattern 125 exposing a top surface of the active region. The gate insulating pattern 125 includes a silicon oxide pattern 123 and an upper insulating pattern 124, which are sequentially stacked. The gate insulating pattern 125 exposes a region where the floating diffusion region may be formed. The photoresist pattern 510 is then removed.

A pre-floating diffusion region 142 is formed in the active region exposed through the gate insulating pattern 125. The pre-floating diffusion region 142 is formed using diffusion, ion implantation, or in-situ doping. For forming the pre-floating diffusion region 142, a sacrificial layer containing impurities may be formed on a semiconductor substrate 100 without the photoresist pattern 510. Preferably, the sacrificial layer is removed after impurities in the sacrificial layer are diffused into the active region through the opening. When the sacrificial layer is removed, it is preferable to use an etch recipe wherein the sacrificial layer is etched more rapidly than the semiconductor substrate 100 and the upper insulating pattern 124. The sacrificial layer may be made of polysilicon.

Following formation of the pre-floating diffusion region 142, the upper insulating pattern 124 may be removed by means of the etch recipe wherein the etch rate of the upper insulating pattern 124 is faster than the etch rate of the silicon oxide pattern 123 and the semiconductor substrate 100. Subsequent steps are identical to those described in connection with the first embodiment. The impurity concentration of the floating diffusion region 140 may be regulated through the step of forming the pre-floating diffusion region 142, which makes it possible to form a floating diffusion region 142 having the suitable impurity concentration.

Returning to FIG. 8, a CMOS image sensor according to the present invention is now described. A device isolation layer 110 is formed at a predetermined region of a semiconductor substrate 100 to define an active region. The semiconductor substrate 100 contains first conductivity type impurities, preferably P-type impurities. A gate conductive pattern 135 is disposed on the active region to form each gate electrode 210 of the reset, select, and access transistors. Preferably, the gate conductive pattern 135 is made of polysilicon containing impurities. Alternatively, the gate conductive pattern 135 may be made of metal materials containing tungsten or silicide. Preferably, the impurities contained in the polysilicon are of a second conductivity type (i.e., N-type).

Sources and/or drains of the transistors are disposed in the active region around the gate conductive pattern 135 used as the gate electrode 210. The sources and/or drains include lightly and heavily doped regions 150 and 180 which constitute a lightly doped drain (LDD) structure. However, it is preferable that the heavily doped region 180 is not disposed at the source of the reset transistor. The source of the reset transistor includes the lightly doped region 150 and is coupled to the floating diffusion region 140. The photodiode region 160 is superposed on the floating diffusion region 140 or spaced apart therefrom. Preferably, the floating diffusion region 140 and the photodiode region 160 contain the second conductivity type (e.g., N-type) impurities. In the case that the reset transistor is turned on, the drain of the reset transistor is connected to a power supply voltage ($V_{DD}$) so that the power supply voltage is applied to the floating diffusion region 140.

A gate insulating pattern 125 having an opening exposing the floating diffusion region 140 is disposed on the active region. In order to form a metal oxide semiconductor (MOS) transistor, the gate insulating pattern 125 is interposed between the gate electrode 210 and the semiconductor substrate 100 while being recessed at other regions. A source plug 200 is disposed on the gate insulating pattern 125 to be in direct contact with the floating diffusion region 140 through the opening. The source plug 200 has the same thickness and materials as the gate conductive pattern 135 constituting the gate electrode 210. Accordingly, the materials of the source plug 200 include polysilicon containing the N-type impurities.

A gate spacer 175 is disposed on sidewalls of the gate conductive pattern 135 used as the gate electrode 210. A spacer layer 170 having the same thickness and materials as the gate spacer 175 is disposed around the photodiode region 160. The spacer layer 170 may extend to the sidewalls and upper portion of the source plug 200. The lightly doped region 150 is disposed beside the heavily doped region 180 and beneath the gate spacer 175. Here, the width of the lightly doped region 150 is approximately equal to the thickness of the gate spacer 175.

An interlayer dielectric layer 190 is disposed on a semiconductor substrate 100 including the gate electrode 210 and the source plug 200. The spacer layer 170 and the gate spacer 175 are disposed below the interlayer dielectric layer 190. The interlayer dielectric layer 190 is patterned to form an opening 192 exposing a top surface of the heavily doped region 180, the source plug 200, and the gate electrode 210. The opening 192 is filled with the plug/interconnection 195 that is disposed to interconnect the sources and/or drains and the gate electrode 210 of the transistors. Preferably, the plug/interconnection 195 is made of tungsten, titanium, titanium nitride, polysilicon, aluminum, or copper. In addition, it is preferable that the gate electrode 210 of the select transistor is electrically connected to the source plug 200 through the plug/interconnection 195. Alternatively, the source plug 200 may be used as the gate electrode 210 of the select transistor.

The source of the select transistor is connected to the drain of the access transistor. Preferably, the source of the select transistor and the drain of the access transistor intersect. The floating diffusion region 140 and the photodiode region 160 may be spaced apart from each other. In this case, the gate electrode 210 of the access transistor is preferably disposed over the active region between the floating diffusion and photodiode regions 140 and 160. Preferably, the gate electrode 210 of the access transistor also includes the gate conductive pattern 135. A CMOS image sensor including the access transistor results in a CMOS image sensor of the 4-transistor structure.

According to the present invention, when a gate conductive layer is deposited for forming a gate electrode, impurities contained in the gate conductive layer are diffused into the semiconductor substrate to form a floating diffusion region. Therefore, it is possible to prevent lattice defects and etch damage which results from ion implantation and dry etching. As a result, a CMOS image sensor having a floating diffusion region with desirable characteristics can be fabricated.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of fabricating an image sensor, the method comprising:
   forming a gate insulating layer on a substrate;
   patterning the gate insulating layer to form a gate insulating pattern having an opening exposing a predetermined region of the substrate;
   forming a conductive layer on the substrate including the gate insulating pattern and forming a floating diffusion region in the substrate below the opening;
   patterning the conductive layer to form gate electrodes and simultaneously to form a discrete conductive pattern contacting the substrate through the opening;
   forming a photodiode region in the substrate adjacent to the previously formed floating diffusion region; and
   forming a source region and a drain region for each of a reset transistor and a select transistor, wherein the floating diffusion region has previously been formed by diffusing at least one impurity from the discrete conductive pattern.

2. The method as recited in claim 1, wherein the conductive layer is made of polysilicon including the at least one impurity.

3. The method as recited in claim 2, wherein the polysilicon including the at least one impurity is formed by at least one of diffusion, ion implantation, and in-situ doping.

4. The method as recited in claim 2, wherein the at least one impurity included in the polysilicon is an N-type impurity.

5. The method as recited in claim 1, wherein the gate insulating layer is made of silicon oxide.

6. The method as recited in claim 1, wherein the gate insulating layer includes a silicon oxide layer and an upper insulating layer stacked on each other.

7. The method as recited in claim 6, wherein the upper insulating layer is made of a material that is etched more rapidly than the silicon oxide layer.

8. The method as recited in claim 1, further comprising forming a pre-floating diffusion region in the substrate under the opening.

9. The method as recited in claim 8, wherein the pre-floating diffusion region is formed by at least one of diffusion, ion implantation, and in-situ doping.

10. The method as recited in claim 6, further comprising removing the upper insulating layer by means of an etch recipe, wherein an etch rate of the upper insulating layer is faster than an etch rate of the silicon oxide layer.

11. The method as recited in claim 1, wherein the discrete conductive pattern contacts the floating diffusion region through the opening.

12. The method as recited in claim 1, wherein the gate electrodes include gates of the reset transistor and the select transistor.

13. The method as recited in claim 12, after forming the source region and the drain region, further comprising a step of forming interconnections electrically contacting respective gates of the reset transistor and the select transistor and the source region and the drain region for each of the reset transistor and the select transistor.

14. The method as recited in claim 1, wherein the discrete conductive pattern constitutes a gate of the select transistor.

15. The method as recited in claim 1, wherein the discrete conductive pattern is electrically connected to a gate of the select transistor.

* * * * *